(12) United States Patent
Hori et al.

(10) Patent No.: US 9,673,129 B2
(45) Date of Patent: Jun. 6, 2017

(54) SEMICONDUCTOR DEVICE

(71) Applicant: FUJI ELECTRIC CO., LTD., Kawasaki-shi, Kanagawa (JP)

(72) Inventors: Motohito Hori, Matsumoto (JP); Yoshikazu Takahashi, Matsumoto (JP); Yoshitaka Nishimura, Azumino (JP); Yoshinari Ikeda, Matsumoto (JP); Hiromichi Gohara, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/850,196

(22) Filed: Sep. 10, 2015

(65) Prior Publication Data

US 2015/0380338 A1    Dec. 31, 2015

Related U.S. Application Data

(63) Continuation of application No. PCT/JP2014/002347, filed on Apr. 25, 2014.

(30) Foreign Application Priority Data

Apr. 25, 2013 (JP) ................................ 2013-092796

(51) Int. Cl.
*H01L 23/373* (2006.01)
*H01L 23/473* (2006.01)
(Continued)

(52) U.S. Cl.
CPC ........ *H01L 23/473* (2013.01); *H01L 23/3735* (2013.01); *H01L 23/49811* (2013.01);
(Continued)

(58) Field of Classification Search
CPC ............. H01L 23/473; H01L 23/49811; H01L 23/3735; H01L 23/49838; H01L 25/073
See application file for complete search history.

(56) References Cited

U.S. PATENT DOCUMENTS 6,245,442 B1 *  6/2001  Towata ................. B22D 19/14
                                                         257/707
7,361,590 B2 *  4/2008  Kobayashi ............. H01L 24/29
                                                        257/E21.021
(Continued)

FOREIGN PATENT DOCUMENTS

JP   H08-335652 A    12/1996
JP   2003-116282 A    4/2003
(Continued)

OTHER PUBLICATIONS

PCT, "International Search Report for International Application No. PCT/JP2014/002347".
(Continued)

*Primary Examiner* — Christine Enad
(74) *Attorney, Agent, or Firm* — Manabu Kanesaka

(57) ABSTRACT

In a semiconductor device, an insulated substrate is bonded with a cooling body with lowered thermal resistance without a holding unit. The semiconductor device includes an insulated substrate where a wiring pattern copper plate unit for forming a plurality of wiring patterns is disposed on one side of an insulating plate unit, and a heat radiation copper plate unit disposed on the other side of the insulating plate unit; a semiconductor chip mounted on the wiring pattern copper plate unit; a cooling body contacted with the heat radiation copper plate unit; and a wiring conductor plate connected between the semiconductor chip and the wiring pattern copper plate unit. The heat radiation copper plate unit and the cooling body are bonded with a metal sintered material, and thicknesses of the wiring pattern copper plate unit and the heat radiation copper plate unit are set to such thermal stress is relaxed.

9 Claims, 18 Drawing Sheets

(51) Int. Cl.
*H01L 23/495* (2006.01)
*H01L 25/07* (2006.01)
*H01L 25/18* (2006.01)
*H01L 23/498* (2006.01)

(52) U.S. Cl.
CPC ........ *H01L 23/49838* (2013.01); *H01L 25/07* (2013.01); *H01L 25/073* (2013.01); *H01L 25/18* (2013.01); *H01L 2924/0002* (2013.01)

(56) References Cited

U.S. PATENT DOCUMENTS

| | | | |
|---|---|---|---|
| 2003/0067749 A1 | 4/2003 | Tamba et al. | |
| 2006/0157862 A1* | 7/2006 | Nishimura | H01L 23/3735 257/772 |
| 2008/0158824 A1* | 7/2008 | Aoki | H01L 23/24 361/711 |
| 2011/0037166 A1* | 2/2011 | Ikeda | H01L 23/3735 257/712 |

FOREIGN PATENT DOCUMENTS

| | | |
|---|---|---|
| JP | 2003-243610 A | 8/2003 |
| JP | 2008-086099 A | 4/2008 |
| JP | 2012-114224 A | 6/2012 |
| JP | 2012-164880 A | 8/2012 |
| JP | 2012-191010 A | 10/2012 |

OTHER PUBLICATIONS

Japan Patent Office, "Office Action for Japanese Patent Application No. 2015-513575," Jun. 7, 2016.

* cited by examiner

SEMICONDUCTOR DEVICE

CROSS-REFERENCE TO RELATED APPLICATION

This is a continuation application of PCT/JP2014/002324 filed on Apr. 25, 2014 claiming priority of Japanese Patent Application No. 2013-092796 filed on Apr. 25, 2014, the disclosure of which is incorporated herein by reference.

TECHNICAL FIELD

The present invention relates to a semiconductor device, such as a power device and a switching IC for high frequencies, and more particularly to a semiconductor device including a power semiconductor element.

BACKGROUND ART

An invertor device, an uninterruptible power supply, a machine tool, an industrial robot or the like use an independent semiconductor device (power semiconductor module).

As a conventional semiconductor device, a power module disclosed in Patent Document 1, for example, is known.

This power module includes, a power module substrate where a metal layer is bonded to both sides of a ceramic substrate, a heat sink, which is temporarily bonded to one of the metal layers via a temporarily sintered Ag layer, and a holding unit that holds the power module substrate and the heat sink in a stacked state.

Patent Document 1: Japanese Patent Application Laid-open No. 2012-114224

DISCLOSURE OF THE INVENTION

In the prior art disclosed in Patent Document 1, the metal layer of the power module substrate and the heat sink are connected via the temporarily sintered Ag layer, and the stacking state of the power module substrate and the heat sink is separately held by the holding unit, so as to prevent cracking of the ceramic substrate and peeling of the bonded portion.

However in the prior art, the metal layer of the power module substrate and the heat sink are connected by an external force via the temporarily sintered Ag layer, so that the base powder slightly flows, therefore thermal resistance is higher than the case of using a completely sintered layer, and separate holding means is required to firmly hold the power module and the heat sink, which causes an unsolved problem of an increase in the overall size of the configuration.

With the foregoing in view, it is an object of the present invention to provide a semiconductor device, wherein an insulated substrate is firmly bonded to a cooling body with lowered thermal resistance, without the holding unit.

To achieve the above object, a first aspect of a semiconductor device according to the present invention includes an insulated substrate where a wiring pattern copper plate unit for forming wiring patterns is disposed on one side of an insulating plate unit, and a heat radiation copper plate unit is disposed on the other side of the insulating plate unit; a semiconductor chip that is mounted on the wiring pattern copper plate unit of the insulated substrate; a cooling body that is bonded to the heat radiation copper plate unit of the insulated substrate; and a wiring conductor plate that is connected to the semiconductor chip and the wiring pattern copper plate unit. The heat radiation copper plate unit of the insulated substrate and the cooling boy are bonded to each other with a metal sintered material, and thickness of the wiring pattern copper plate unit and thickness of the heat radiation copper plate unit are set to thickness at which thermal stress is relaxed.

In a second aspect of the semiconductor device according to the present invention, the thickness of the wiring pattern copper plate unit and the thickness of the heat radiation copper plate unit are set to thickness at which thermal stress is relaxed and thermal resistance is suppressed.

In a third aspect of the semiconductor device according to the present invention, the wiring conductor plate is electrically connected with the semiconductor chip and the wiring pattern copper plate unit via conductive rods.

In a fourth aspect of the semiconductor device according to the present invention, a conductive rod is set such that a cross-sectional area of a fitting portion, which fits with the wiring conductor plate, is larger than a cross-sectional area of a rod portion between the wiring conductor plate, and the semiconductor chip and the wiring pattern copper plate unit.

In a fifth aspect of the semiconductor device according to the present invention, the semiconductor chip is a chip integrally formed of an insulated gate bipolar transistor and a free wheeling diode inversely connected to the insulated gate bipolar transistor.

In a sixth aspect of the semiconductor device according to the present invention, the thickness of the wiring pattern copper plate unit and the thickness of the heat radiation copper plate unit are set to 0.7 mm or more.

In a seventh aspect of the semiconductor device according to the present invention, the wiring pattern copper plate unit of the insulated substrate further comprises an upper arm wiring pattern unit on which a semiconductor chip constituting an upper arm is mounted, a lower arm wiring pattern unit on which a semiconductor chip constituting a lower arm is mounted, and a ground wiring pattern unit, which are formed on the insulating plate unit independently from one another.

In an eighth aspect of the semiconductor device according to the present invention, a cathode side connection terminal is connected to the upper arm wiring pattern unit, an output terminal is connected to the lower arm wiring pattern unit, and an anode side connection terminal is connected to the ground wiring pattern unit.

In a ninth aspect of the semiconductor device according to the present invention, the wiring conductor plate is constituted by a first wiring conductor plate unit that connects the semiconductor chip constituting the upper arm and the lower arm wiring pattern unit, and a second wiring conductor plate unit that connects the semiconductor chip constituting the lower arm and the ground wiring pattern unit.

According to the present invention, even if the heat radiation copper plate unit of the insulated substrate and the cooling body are connected by sintering, the thermal stress can be relaxed by the heat radiation copper plate unit and the wiring pattern copper plate unit. Therefore, it is unnecessary to dispose a holding unit to hold the insulated substrate and the cooling body, and as a result, cracking of the insulating plate unit of the insulated substrate and peeling of the bonded portion can be prevented, and the entire structure can be minimized while insuring the heat radiation effect.

BRIEF DESCRIPTION OF THE DRAWINGS

FIG. 9A is an equivalent circuit diagram and FIG. 9B is a plan view depicting the current passing locations;

FIG. 10A is an equivalent circuit diagram and FIG. 10B is a plan view depicting the current passing locations;

FIG. 11A is an equivalent circuit diagram and FIG. 11B is a plan view depicting the current passing locations;

FIG. 12A is an equivalent circuit diagram and FIG. 12B is a plan view depicting the current passing locations;

FIG. 13A is an equivalent circuit diagram and FIG. 13B is a plan view depicting the current passing locations;

FIG. 14A is an equivalent circuit diagram and FIG. 14B is a plan view depicting the current passing locations;

FIG. 15A is an equivalent circuit diagram and FIG. 15B is a plan view depicting the current passing locations;

FIG. 16A is an equivalent circuit diagram and FIG. 16B is a plan view depicting the current passing locations;

FIG. 17A is an equivalent circuit diagram and FIG. 17B is a plan view depicting the current passing locations;

BEST MODE FOR CARRYING OUT THE INVENTION

Embodiments of the present invention will now be described with reference to the drawings.

Figure 1:
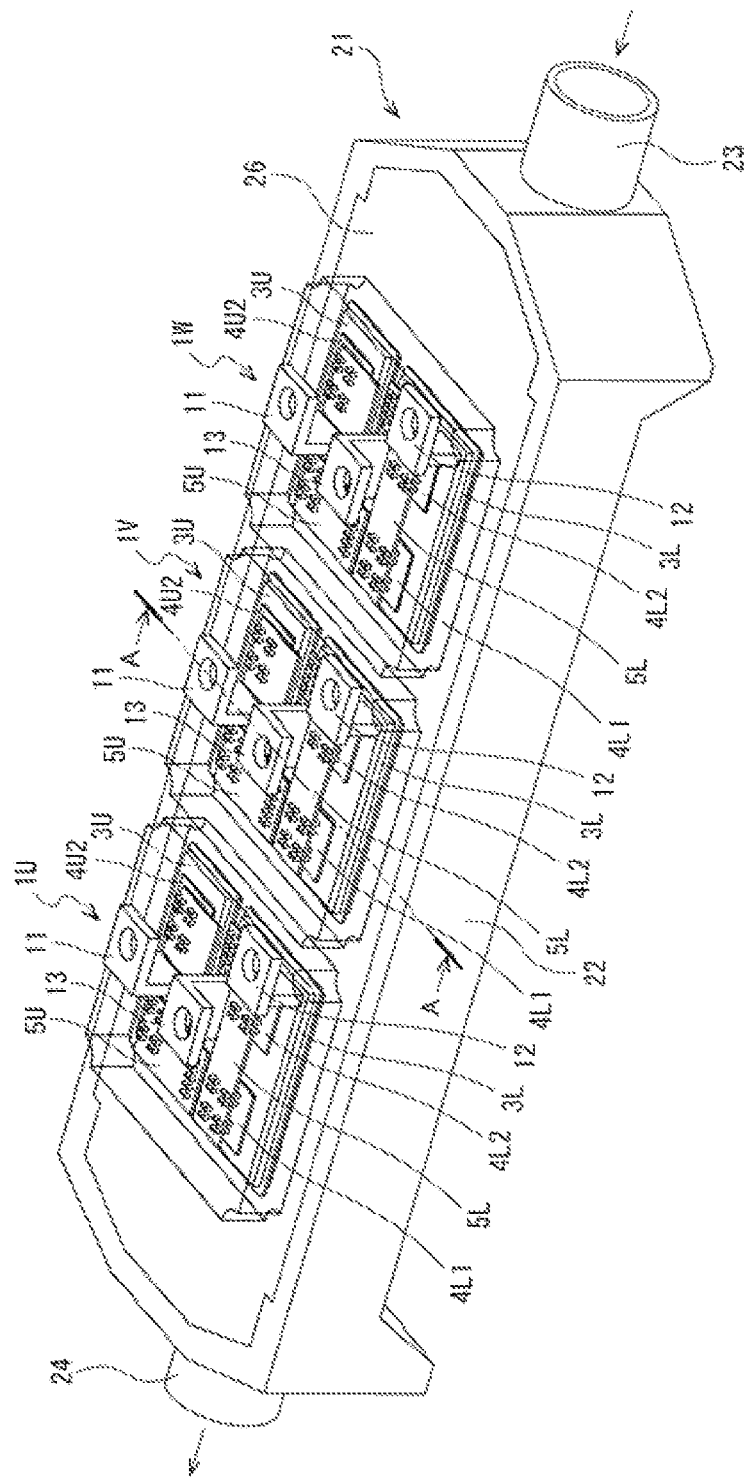
FIG. 1 is a perspective view showing Embodiment 1 of the semiconductor device according to the present invention.
Figure 2:
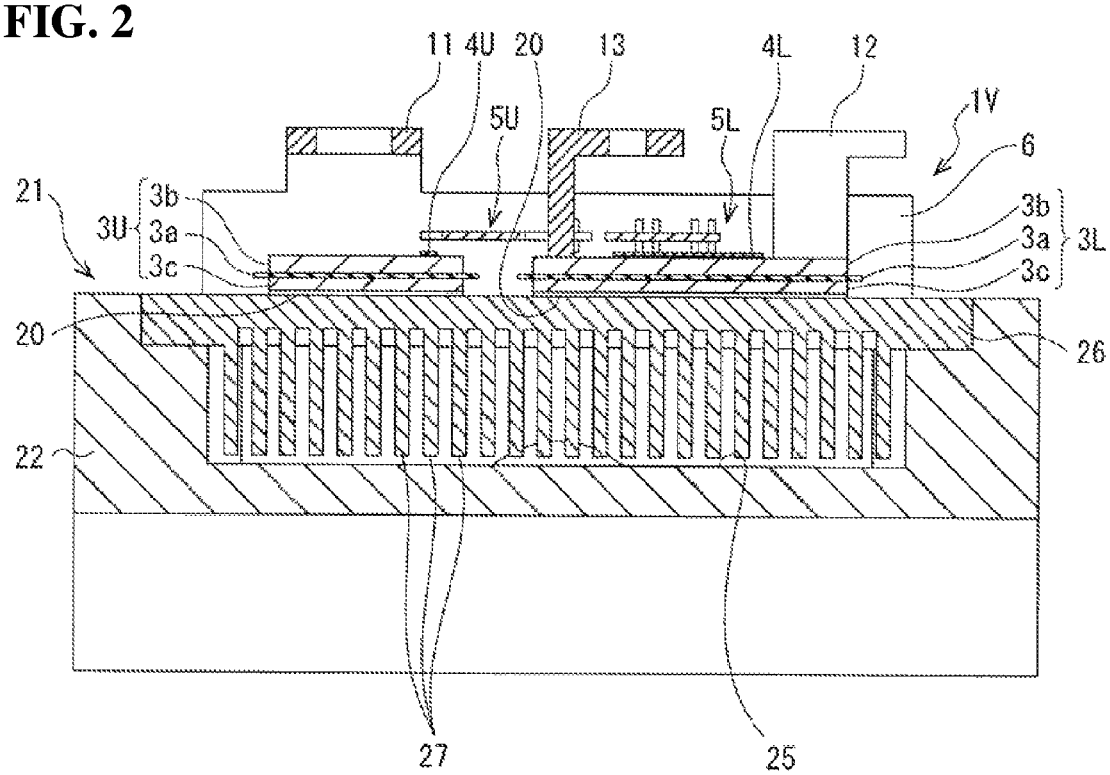
FIG. 2 is an enlarged cross-sectional view taken along line A-A in FIG. 1.

FIG. 1 is a perspective view showing a general configuration according to Embodiment 1 of the semiconductor of the present invention, and FIG. 2 is a cross-sectional view taken along line A-A in FIG. 1.

In FIG. 1, numeral 1 is a semiconductor device, and in this semiconductor device 1, three power semiconductor modules 1U, 1V and 1W are secured on a cooling body 21 in the longitudinal direction at predetermined intervals.

Figure 3:
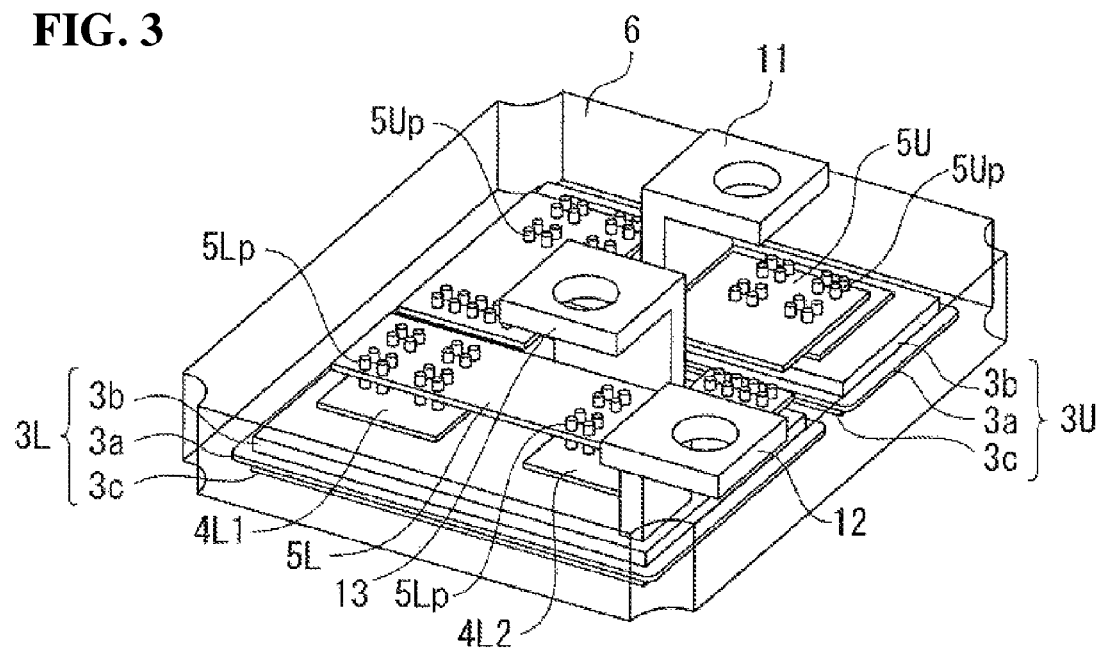
FIG. 3 is an enlarged perspective view showing the power semiconductor module of FIG. 1.
Figure 4:
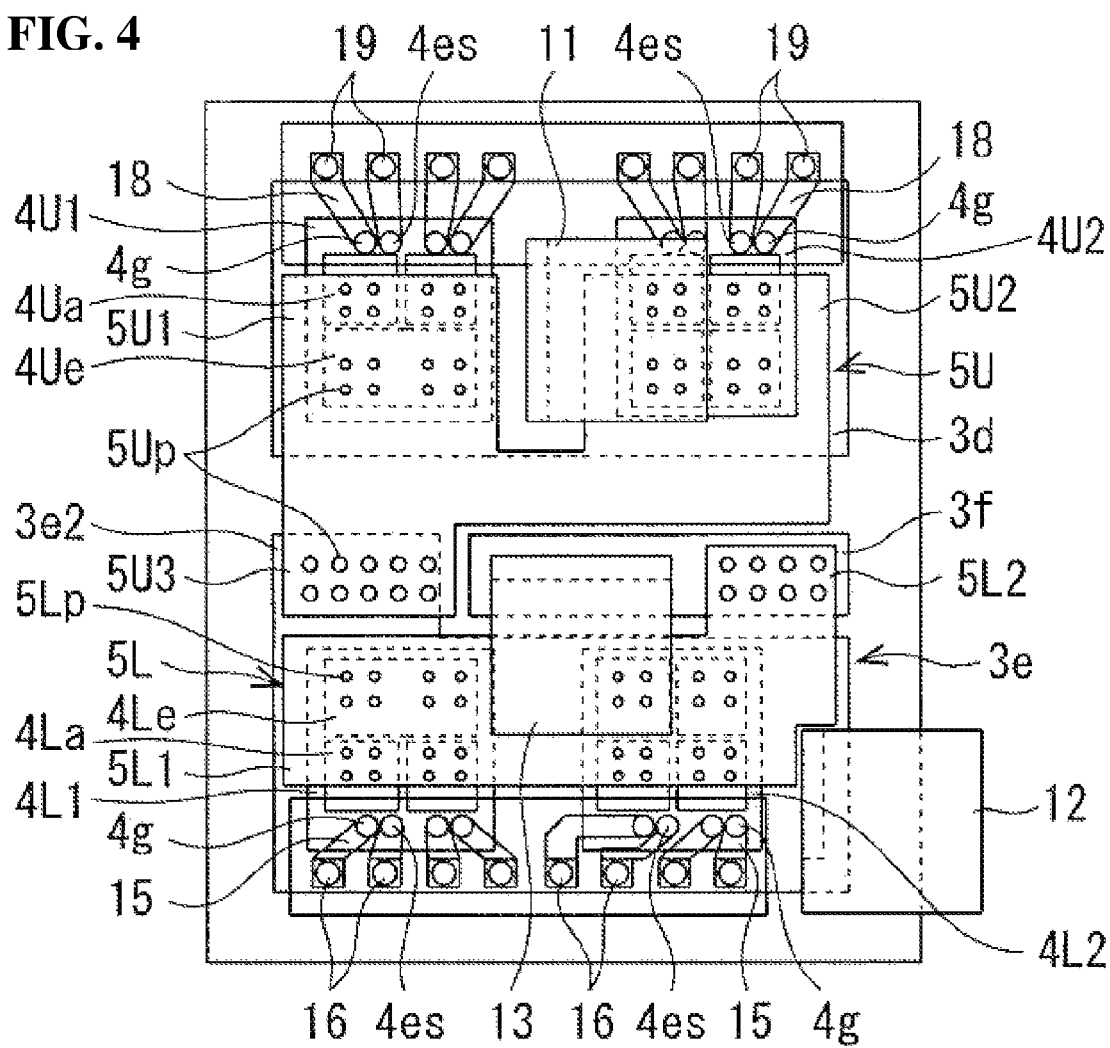
FIG. 4 is a plan view showing the semiconductor device in FIG. 3 excluding the insulated resin sealing member.
Figure 5:
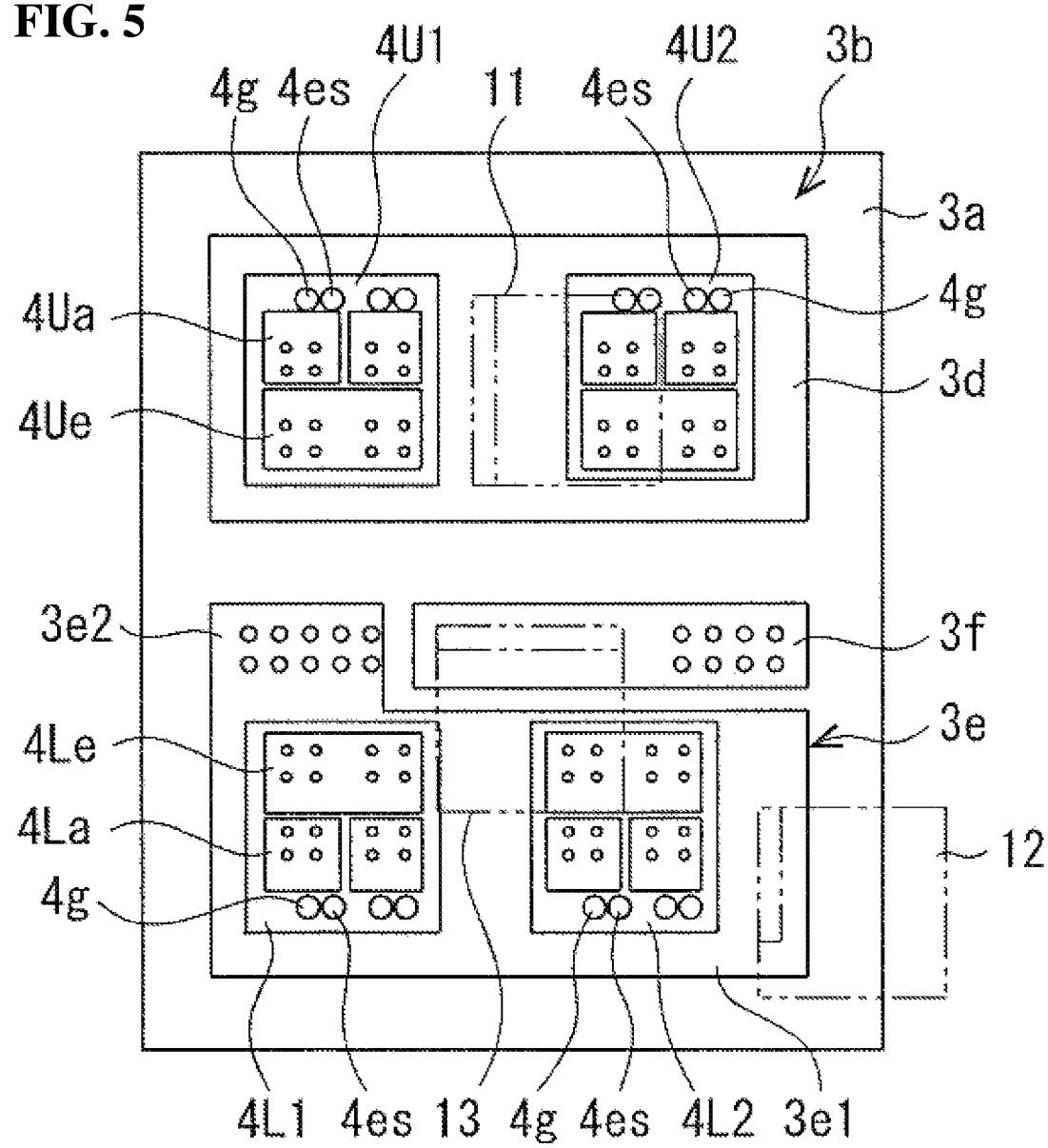
FIG. 5 is a plan view showing the insulated substrate on which the semiconductor chip in FIG. 4 is mounted.

Each power semiconductor module, 1U, 1V and 1W has an identical configuration, where as illustrated in FIG. 2, a semiconductor chip 4U constituting an upper arm and a semiconductor chip 4L constituting a lower arm are mounted on an upper arm insulated substrate 3U and a lower arm insulated substrate 3L respectively. As illustrated in FIG. 3 to FIG. 5, an upper arm wiring conductor plate 5U as a first wiring conductor plate unit and a lower arm wiring conductor plate 5L as a second wiring conductor plate unit, on which conductor posts 5Up and 5Lp as conductor rods are secured respectively with predetermined intervals, are disposed on each of the semiconductor chips 4U1, 4U2, 4L1 and 4L2.

The insulated substrates 3U and 3L, the semiconductor chips 4U1, 4U2, 4L1 and 4L2, the upper arm wiring conductor plate 5U and the lower arm wiring conductor plate 5L are sealed by an insulating resin sealing member 6 formed of epoxy resin material (thermo-setting resin), for example, in a state of exposing the bottom faces of the insulated substrates 3U and 3L.

As illustrated in FIG. 2 and FIG. 3, each of the insulated substrates 3U and 3L is formed, for example, by an insulating plate unit 3a constituted by a silicon nitride substrate, a wiring pattern copper plate unit 3b, which is constituted by a thick copper plate and is bonded to the upper surface of the insulating plate unit 3a, and a heat radiation copper plate unit 3c which is constituted, similarly to the wiring pattern copper plate unit 3b, by a thick copper plate and is bonded to the lower surface of the insulating plate unit 3a.

Here as illustrated in FIG. 5, the wiring pattern copper plate unit 3b of the upper arm insulated substrate 3U is constituted by an upper arm wiring pattern unit 3d, and the wiring pattern copper plate unit 3b of the lower arm insulated substrate 3L is constituted by a lower arm wiring pattern unit 3e and a ground wiring pattern unit 3f.

The upper arm wiring pattern unit 3d has a rectangle extending transversely in plan view, and is disposed on the upper surface of the wiring pattern copper plate unit 3b of the upper arm insulated substrate 3U.

The lower arm wiring pattern unit 3e is L-shaped in plan view, constituted by a rectangular chip mounting portion 3e1 and a connection portion 3e2 which is connected to the rear side end face on the left edge of the chip mounting portion 3e1, and is disposed on the upper surface of the wiring pattern copper plate unit 3b of the lower arm insulated substrate 3L.

The ground wiring pattern unit 3f has a rectangle extending transversely in plan view, and is disposed on the rear end face of the chip mounting portion 3e1 and the right end face of the connection portion 3e2 of the lower arm wiring pattern unit 3e in the wiring pattern copper plate unit 3b of the lower arm insulated substrate 3L, with a predetermined interval respectively in an insulated state.

The heat radiation copper plate unit 3c is disposed on the lower surface side of the insulating plate unit 3a of each insulate substrate 3U and 3L, so as to overlap with the wiring pattern units 3d, 3e and 3f respectively in plan view.

Figure 6A:
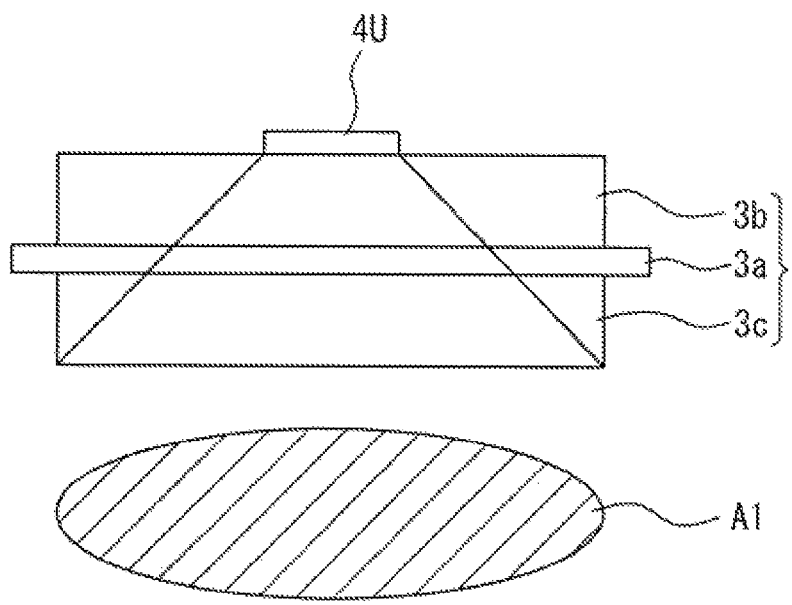
FIGS. 6(a), 6(b) are diagrams showing a relationship between a thickness of the copper plate unit constituting the insulated substrate and the heating area.
Figure 6B:
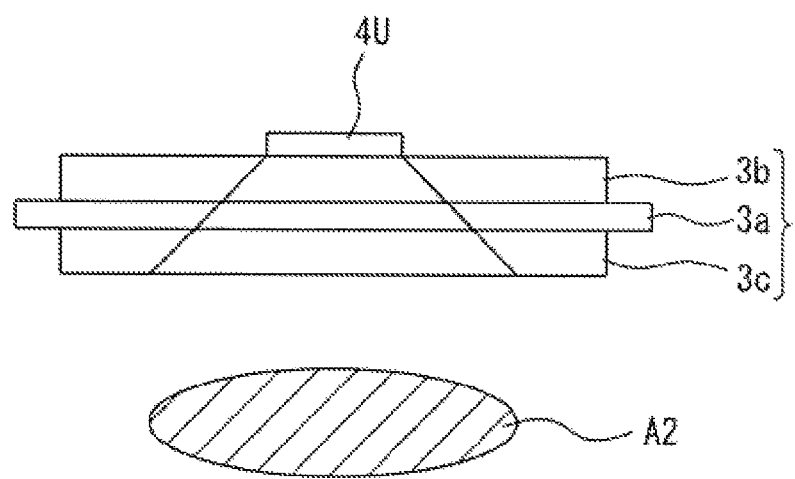

Here the wiring pattern copper plate unit 3b and the heat radiation copper plate unit 3c are constituted by copper plates having a same thickness from 0.7 mm or more (preferably 1 mm or more), for example, in order to relax the thermal stress and suppress thermal resistance. When semiconductor chips 4U1, 4U2, 4L1 and 4L2 are mounted on the wiring pattern copper plate unit 3b, heat generated in these semiconductor chips 4U1, 4U2, 4L1 and 4L2 is diffused through the wiring pattern copper plate unit 3b, the insulating plate unit 3a and the heat radiation copper plate unit 3c, reaching the bottom face of the heat radiation copper plate unit 3c as illustrated, and the heating area A1 at this time can be wider if the thickness of the wiring pattern copper plate unit 3b and that of the heat radiation copper plate unit 3c are set to 0.7 mm or more, as illustrated in FIG. 6A. If the thickness of the wiring pattern copper plate unit 3b is set to 0.6 mm or less, on the other hand, the heating area A2, when the heat reaches the bottom face of the heat radiation copper plate unit 3c, becomes smaller than the heating area A1, as shown in FIG. 6B.

Each thermal resistance Rth [K/W] of the insulating plate unit 3a, the wiring pattern copper plate unit 3b and the heat radiation copper plate unit 3c is given by Expression (1), where t[m] denotes thickness of a heat transfer element, λ[W/mK] denotes thermal conductivity, and A[m$^2$] denotes a heating area on the bottom face side.

$$Rth = t/\lambda A \quad (1)$$

Since the change of the heating area is greater than the change of the thickness, the thermal resistance Rth is controlled to be smaller and the heat radiation effect can be improved as the thickness increases.

The thermal resistance of the entire insulated substrate 3 is the sum of the thermal resistances Rth of the plate units 3a to 3c. Here the thermal conductivity λ of the insulating plate unit 3a is smaller than the thermal conductivity of the copper plate, hence it is preferable to set the thickness t of the insulating plate unit 3a low.

When the device loss is Q[W], the temperature increase amount ΔT is determined by multiplying the thermal resistance Rth by the device loss Q, as shown in Expression (2).

$$\Delta T = Rth \times Q \quad (2)$$

The device loss is constant, hence if the thermal resistance Rth is a low value, the temperature increase amount ΔT is suppressed, and a good heat radiation effect is implemented.

The linear expansion coefficient α1 of copper is 16 ppm to 18 ppm, the linear expansion coefficient α2 of the insulating plate unit 3a is 3 ppm to 5 ppm, and the linear expansion coefficient of aluminum, forming the cooling body 21, is about 22 ppm, therefore thermal stress can be relaxed by inserting the heat radiation copper plate unit 3c between the insulating plate unit 3a and the cooling body 21.

Therefore if the thickness of the wiring pattern copper plate unit 3b and that of the heat radiation copper plate unit 3c are 0.6 mm or less, then a sufficient heat radiation effect cannot be implemented, and the copper plate units easily become deformed and do not contribute to relaxing thermal stress, but if the thickens thereof is 0.7 mm or more, a sufficient heat radiation effect and relaxing the thermal stress can be obtained simultaneously.

Semiconductor chips 4U1 and 4U2, enclosing two sets of reverse conducting insulated gate bipolar transistors (hereafter called "reverse conducting IGBT") constituting the upper arm, are mounted on the upper arm wiring pattern unit 3d via such bonding material as solder, for example, as illustrated in FIG. 5.

Semiconductor chips 4L1 and 4L2, including two sets of reverse conducting IGBTs constituting the lower arm, are mounted on the chip mounting portion 3e1 of the lower arm wiring pattern unit 3e via such bonding material as solder, as illustrated in FIG. 5.

Here the reverse conducting IGBT is formed by integrating an IGBT and a free wheeling diode (FWD) reversely connected to the IGBT into one chip. Therefore, compared with the case of the two semiconductor chips which include the IGBT and FWD respectively, the area in the plan view can be reduced by half.

Further, a cathode side connection terminal 11 constituting a main terminal is fixed on the upper arm wiring pattern unit 3d via such bonding material as solder, as indicated by the two-dot chain line in FIG. 5. In the same manner, an output terminal 12 constituting the main terminal is fixed on the lower arm wiring pattern unit 3e via such bonding material as solder, as indicated by the two-dot chain line in FIG. 5. Furthermore, an anode side connection terminal 13 constituting the main terminal is fixed on the ground wiring pattern unit 3f via such bonding material as solder, as indicated by the two-dot chain line in FIG. 5.

Both the upper arm wiring conductor plate 5U and the lower arm wiring conductor plate 5L are constituted by a flat copper plate respectively. As illustrated in FIG. 4, the upper arm wiring conductor plate 5U is arranged such that the chip counter plate units 5U1 and 5U2, which face the semiconductor chips 4U1 and 4U2 from the top and a connection plate unit 5U3 which faces the connection portion 3e2 of the lower arm wiring pattern unit 3e from the top, are interconnected.

Further as illustrated in FIG. 4, the chip counter plate units 5U1 and 5U2 are electrically connected to an emitter electrode 4Ue and an anode electrode 4Ua of the reverse conducting IGBT formed on the upper surface of the semiconductor chips 4U1 and 4U2 via a plurality of conductive posts 5Up which is formed cylindrically as conductive rods. The connection plate unit 5U3 is electrically connected to the connection portion 3e2 of the lower arm wiring pattern unit 3e via a plurality of conductive posts 5Up as the conductive rods.

Figure 7:
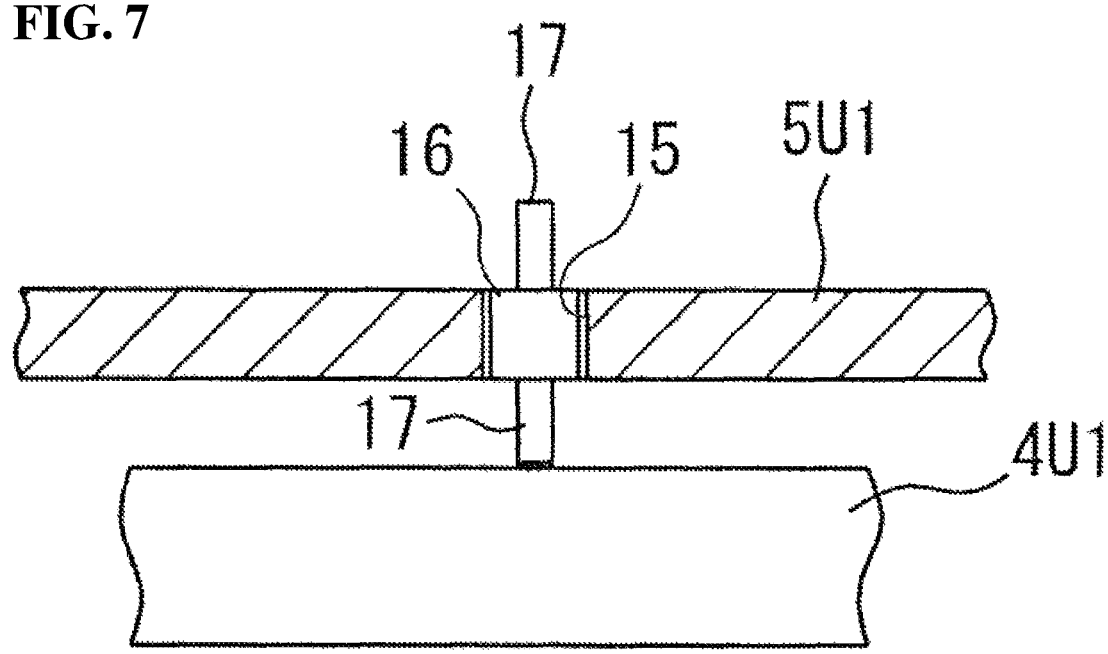
FIG. 7 is an enlarged cross-sectional view showing the wiring conductor plate.

As illustrated in FIG. 7, each conductive post 5Up is constituted by a fitting portion 16 which is fitted with a through hole 15 formed in the upper arm wiring conductor plate 5U (inner surface of the through hole 15 is tin (Sn) plated, for example) and has a large diameter portion, and by a rod portion 17 which extends up and down from the center portion of the upper and lower surfaces of the fitting portion 16 and has a smaller diameter portion.

Each conductive post 5Up is secured on the upper arm wiring conductor plate 5U by the fitting portion 16 that is fitted in the through hole 15, and the lower face of the rod portion 17 extending downward is electrically connected to the semiconductor chips 4U1, 4U2 and the connection portion 3e2 of the lower arm wiring pattern unit 3e individually by soldering, sintering of metal particles or the like. If soldering is performed, solder paste is coated on the bonding position of each conductive post 5Up and 5Lp, and the conductive posts 5Up and 5Lp of the upper arm wiring conductor plate 5U and the lower arm wiring conductor plate 5L are placed on the solder paste respectively and then reflow processing is performed so that the conductive posts 5Up and 5Lp can be soldered at the same time. The rod portion 17 extending upward from the conductive post 5Up may be omitted.

As illustrated in FIG. 4, the lower arm wiring conductor plate 5L is constituted by a chip counter plate unit 5L1 facing the semiconductor chips 4L1 and 4L2, and a connection plate unit 5L2 facing the right edge of the ground wiring pattern unit 3f, and the chip counter plate unit 5L1 and the connecting plate unit 5L2 are connected with each other.

The chip counter plate unit 5L1 is electrically connected independently to an emitter electrode 4Le and an anode electrode 4La of reversely conducting IGBTs which are formed on the upper surfaces of the semiconductor chips 4L1 and 4L2, via a plurality of conductive posts 5Lp having a similar configuration as the above mentioned conductive post 5Up. The connection plate unit 5L2 is also connected to the right end side of the ground wiring pattern unit 3f via a plurality of conductive posts 5Lp having a similar configuration as the above mentioned conductive post 5Up.

Control electrodes for the gate electrodes 4g and the emitter current sense electrodes 4es of the upper arm semiconductor chips 4U1 and 4U2 and the lower arm semiconductor chips 4L1 and 4L2 are connected to an external connection control terminal 19 via a lead frame 18.

The insulated substrates 3U, 3L, the semiconductor chips 4U1, 4U2 and the wiring conductor plates 5U, 5L are molded by an insulating resin sealing member 6, and the cathode side connection terminal 11, the output terminal 12, the anode side connection terminal 13 and the external connection control terminal 19 protrude from the upper surface.

The above is the concrete configurations of the power semiconductor modules 1U, 1V and 1W. These power semiconductor modules 1U, 1V and 1W are bonded to the cooling body 21 having a configuration of a water-cooling jacket by metal sintered material. The bottom face of the heat radiation copper plate unit 3c of the insulated substrate 3 of each power semiconductor module 1U, 1V and 1W is contacted with a metal particle containing paste (containing such metal particles as Ag), which is coated onto the upper surface of the cooling body 21, and is bonded with the metal sintered material 20, which is formed by pressurizing and heating (sintering processing) in this state. If the sintering processing is performed like this by pressurizing and heating the heat radiation copper plate units 3c of the power semiconductor modules 1U, 1V and 1W placed on the metal particle containing paste, the metal particles are sintered by evaporating the organic solvent, and this metal sintered material 20 allows firm bonding and high thermal conductivity as about a 25 μm relatively thin bonding member. If the thickness of the wiring pattern copper plate unit 3b and that of the heat radiation copper plate unit 3c are thick, i.e. 0.7 mm or more, a thin and uniform bonding member layer can be formed with good reproducibility.

This cooling body 21 has a case body 22, as illustrated in FIG. 1, which is formed from metal material having high thermal conductivity, such as aluminum or aluminum alloy, using die cast molding. An inlet 23 for injecting cooling water (cooling medium) is formed on one of the left and right edges of the case body 22, and an outlet 24 for discharging the cooling water is formed on the other thereof.

In an intermediate portion of the case body 22, a cooling water passage 25, with an upper end in the extending direction opened, is formed, as illustrated in FIG. 2. A lid 26 is fitted there via a sealing member so as to close the cooling water passage 25. This lid 26 protrudes downward toward the lower surface, and cooling fins 27, which extend in the longitudinal direction, are disposed with predetermined intervals in the width direction. Cooling water flows through the cooling fins 27.

The power semiconductor modules 1U, 1V and 1W are bonded to the upper surface of the lid 26 with the metal sintered material 20 by the sintering processing on the metal particles.

Figure 8:
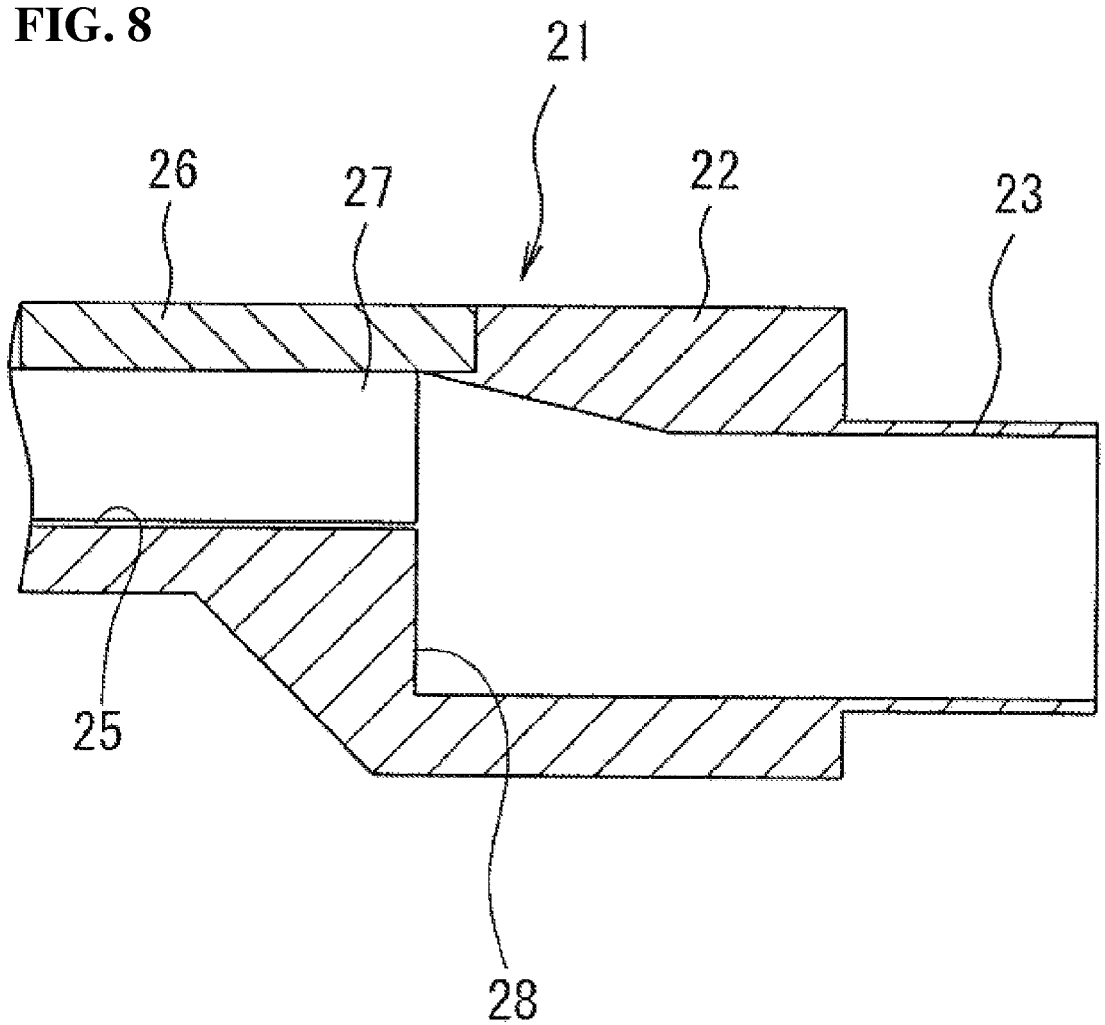
FIG. 8 is a cross-sectional view showing the cooling body.

The connecting portion between the inlet 23 of the case body 22 and the cooling water passages 25 is formed as illustrated in FIG. 8. In other words, the inlet 23 having a large inner diameter and a cooling water passage 25, the thickness of which is smaller than the inlet 23, are disposed in the vertical direction in a step-like manner partially overlapping. A step portion 28, which is a chamfer in the width direction, is formed between the bottom of the inlet 23 of the cooling water injected from the cooling water passage 25 and the bottom of the cooling water passage 25. Therefore, the cooling water injected from the inlet 23 contacts the step portion 28, and spreads in the width direction of the cooling body 21, and cooling water can uniformly flow in the width direction of the cooling water passage 25 and cool each cooling fin 27 uniformly.

Now the operation according to this embodiment will be described with reference to FIG. 9A to FIG. 17B.

Figure 9A:
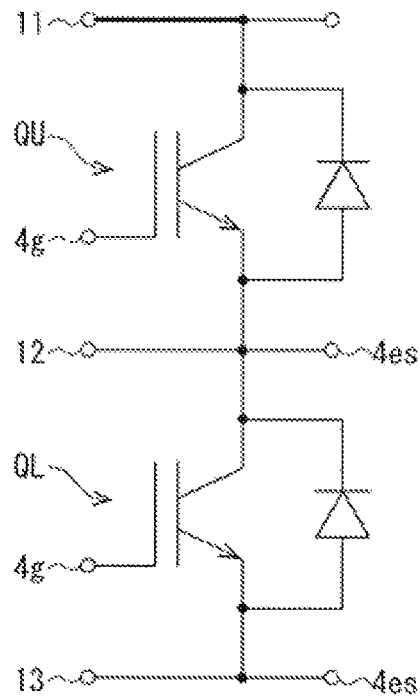
FIGS. 9A, 9B show diagrams showing a current input start state that is used for describing the operation of the present invention, where
Figure 9B:
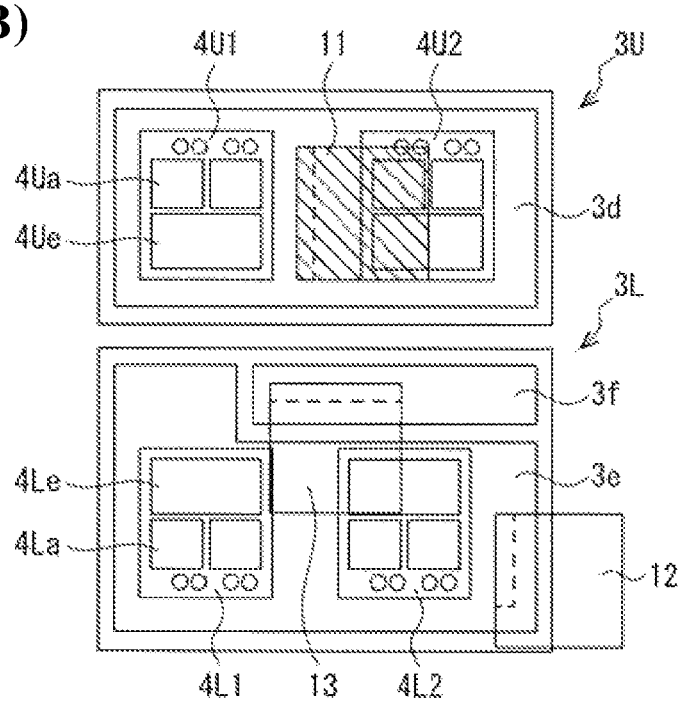

The equivalent circuit of each power semiconductor module 1U to 1W has a configuration as illustrated in FIG. 9A, where a reverse conducting IGBTQU constituting the upper arm and a reverse conducting IGBTQL constituting the lower arm are connected in series between the cathode side connection terminal 11 constituting the main terminal and the anode side connection terminal 13 constituting the main terminal.

Therefore, when low level gate voltage is applied to the gate electrode 4g of the reverse conducting IGBTQL of the lower arm to generate the OFF state, a gate voltage that switches between ON and OFF is applied to the gate electrode 4g of the reverse conducting IGBTQU of the upper arm to generate the switching state. In this case, when the reverse conducting IGBTQU is turned ON, current flows from the cathode side connection terminal 11 to the reverse conducting IGBTQU as illustrated in FIG. 9A. As a result, current flows to the cathode side connection terminal 11 in the hatched portion in FIG. 9B.

Figure 10A:
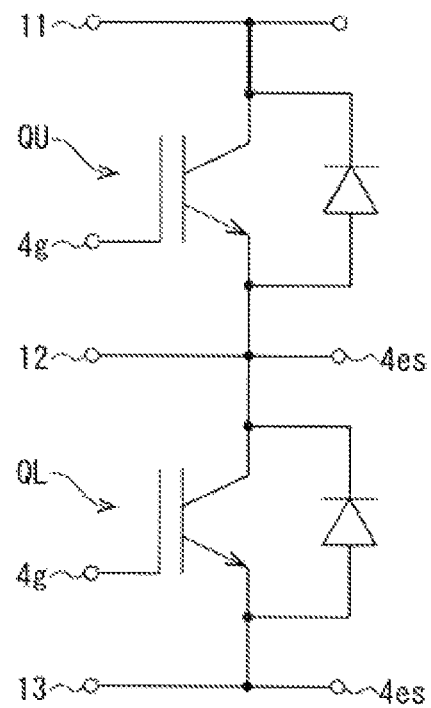
FIGS. 10A, 10B shows diagrams showing the current input state to the collector of the upper arm that is used for describing the operation of the present invention, where
Figure 10B:
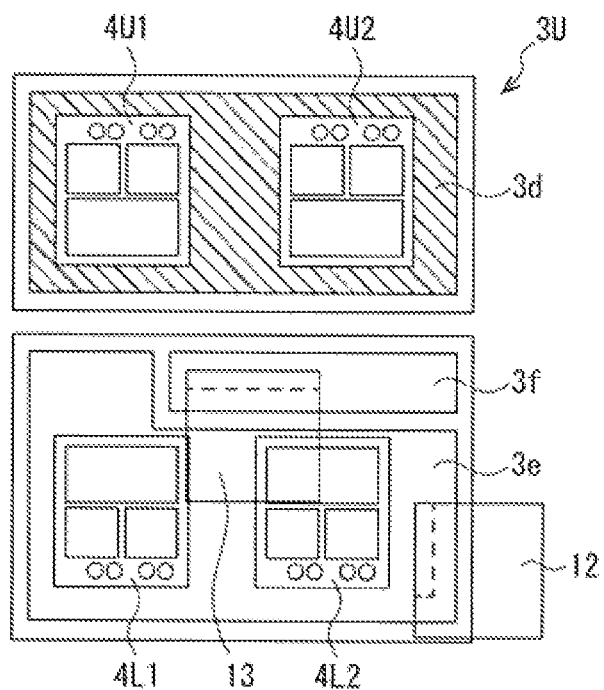

As illustrated in FIG. 10A and FIG. 10B, the current from the cathode side connection terminal 11 is inputted to the collector electrode of the reverse conducting IGBT included in each of the upper arm semiconductor chips 4U1 and 4U2 via the upper arm wiring pattern unit 3d of the upper arm insulated substrate 3U.

Figure 11A:
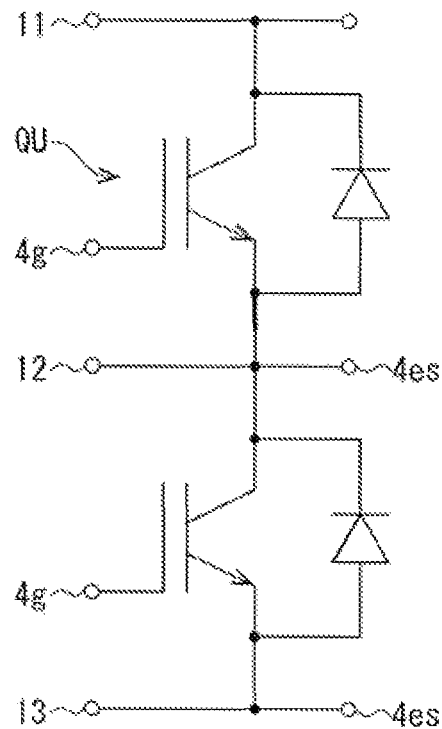
FIGS. 11A, 11B show diagrams showing a current output state from the emitter of the upper arm, that is used for describing the operation of the present invention, where
Figure 11B:
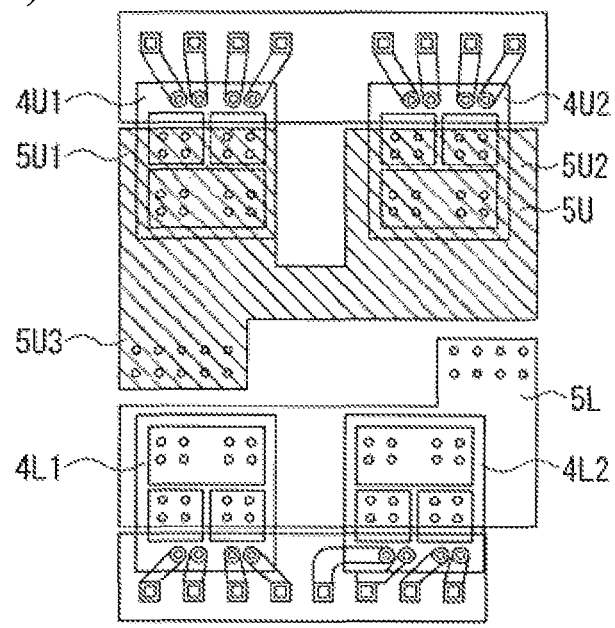

Then, the current is outputted from the emitter electrode via the collector electrode of the reverse conducting IGBT, as illustrated in FIG. 11A and FIG. 11B. The current outputted from the emitter electrode is supplied to the connection portion 3e2 of the lower arm wiring pattern unit 3e of the lower arm insulated substrate 3L via the chip counter plate units 5U1 and 5U2 of the upper arm wiring conductor plate 5U, and then, via the connection plate unit 5U3, as illustrated in FIG. 11B.

Figure 12A:
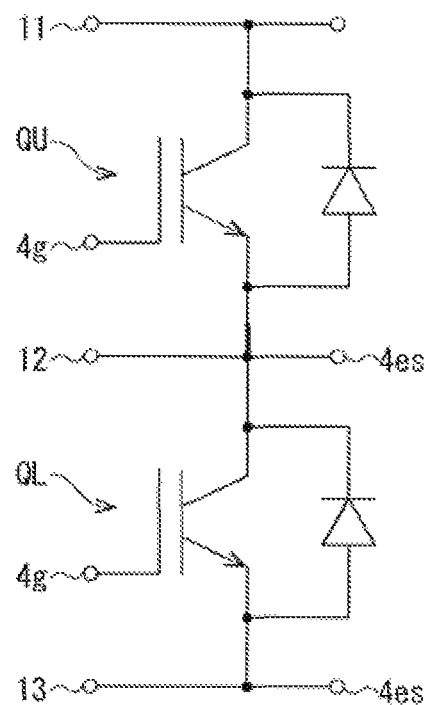
FIGS. 12A, 12B show diagrams showing a current output state from the emitter of the upper arm to the output terminal side, that is used for describing the operation of the present invention, where
Figure 12B:
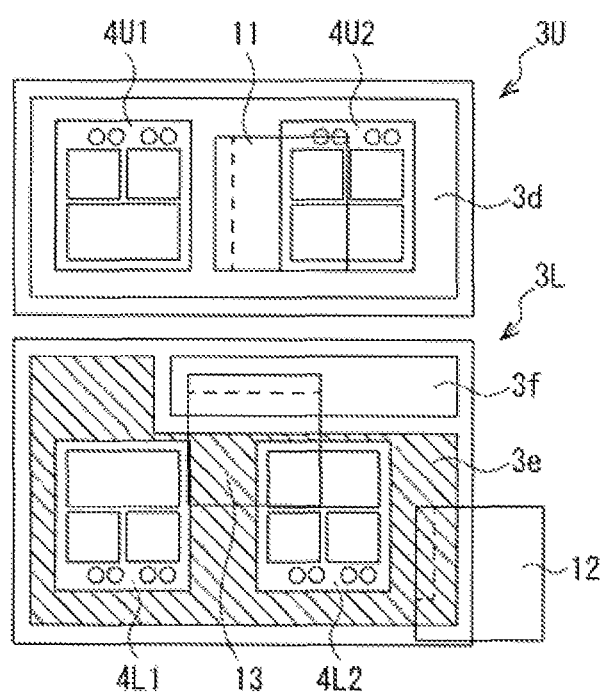
Figure 13A:
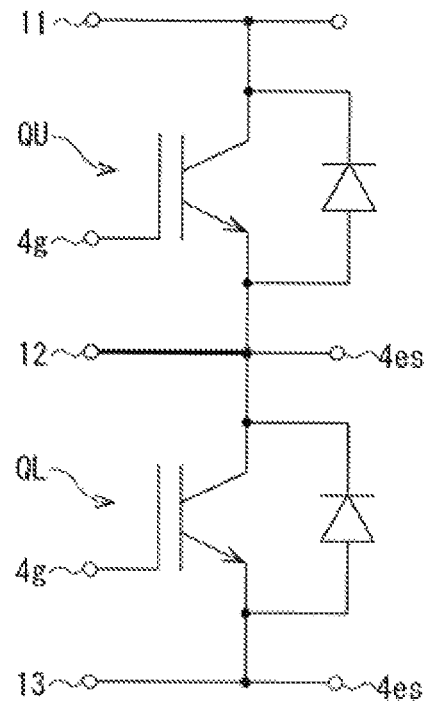
FIGS. 13A, 13B show diagrams showing the current output state to the output terminal, that is used for describing the operation of the present invention, where
Figure 13B:
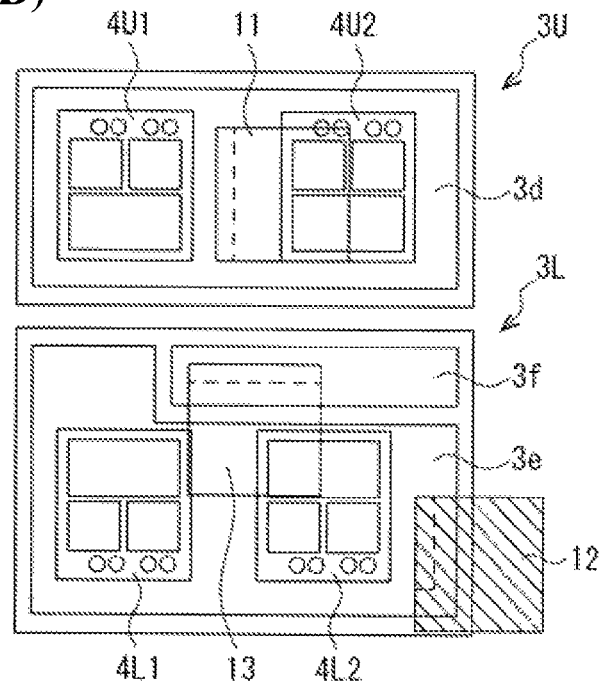

The current supplied to the connection portion 3e2 passes through the lower arm wiring pattern unit 3e, as illustrated in FIG. 12A and FIG. 12B, and is outputted from the output terminal 12, as illustrated in FIG. 13A and FIG. 13B.

Figure 14A:
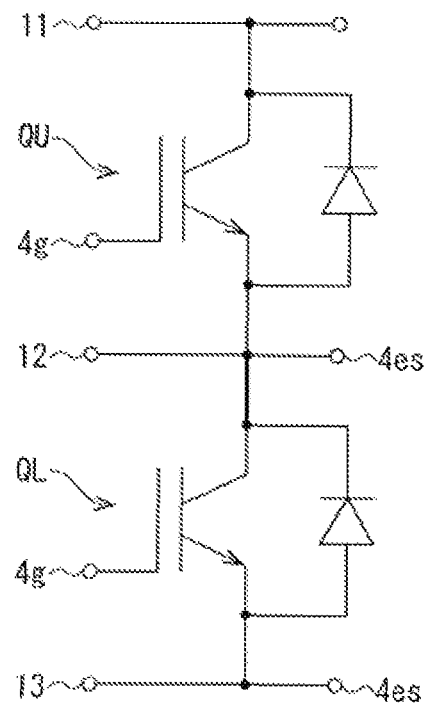
FIGS. 14A, 14B show diagrams showing the current input state to the collector of the lower arm, that is used for describing the operation of the present invention, where
Figure 14B:
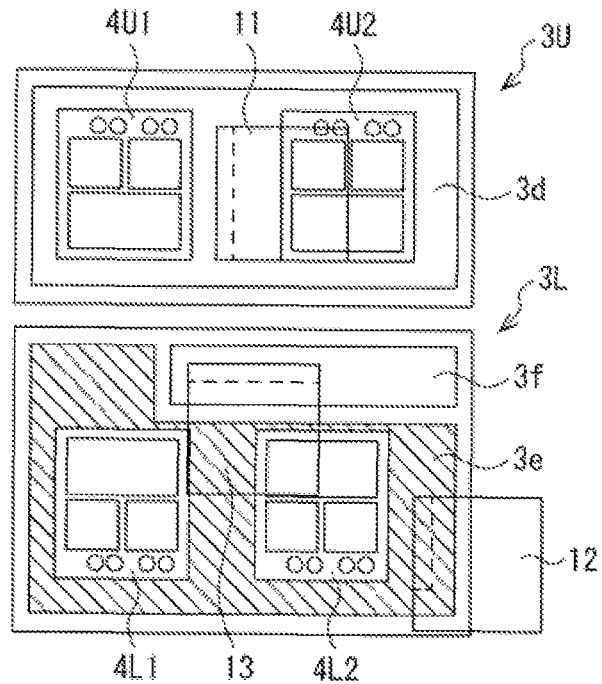

When low level gate voltage is applied to the gate electrode 4g of the reverse conducting IGBTQU of the upper arm to generate the OFF state of this reverse conducting IGBTQU, the gate voltage that switches between ON and OFF is applied to the gate electrode 4g of the reverse conducting IGBTQL of the lower arm to generate the switching state. In this case, when the reverse conducting IGBTQL is turned ON, current inputted from the output terminal 12 is inputted to the collector electrode of the reverse conducting IGBTQL of the lower arm via the lower arm wiring pattern unit 3e of the lower arm insulated substrate 3L, as illustrated in FIG. 14A and FIG. 14B.

Figure 15A:
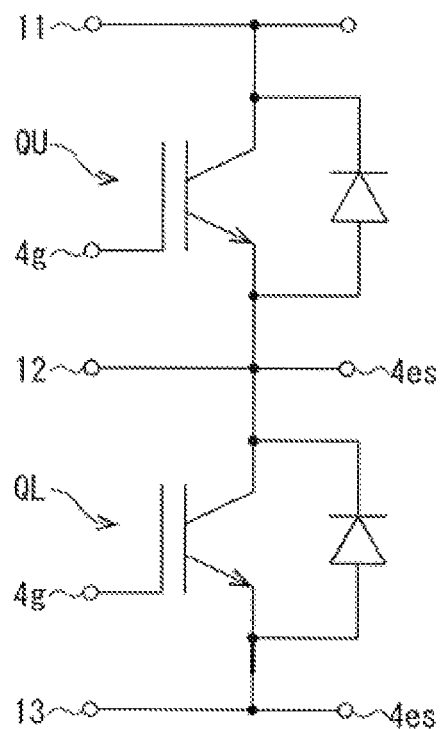
FIGS. 15A, 15B show diagrams showing the current output state from the emitter of the lower arm, that is used for describing the operation of the present invention, where
Figure 15B:
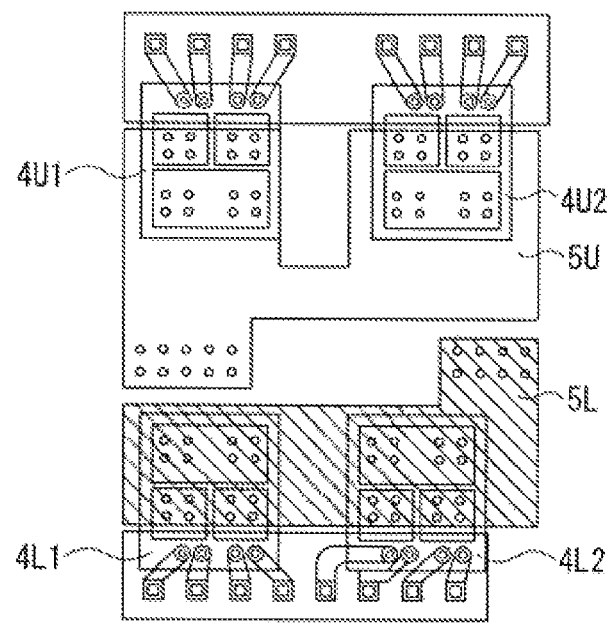
Figure 16A:
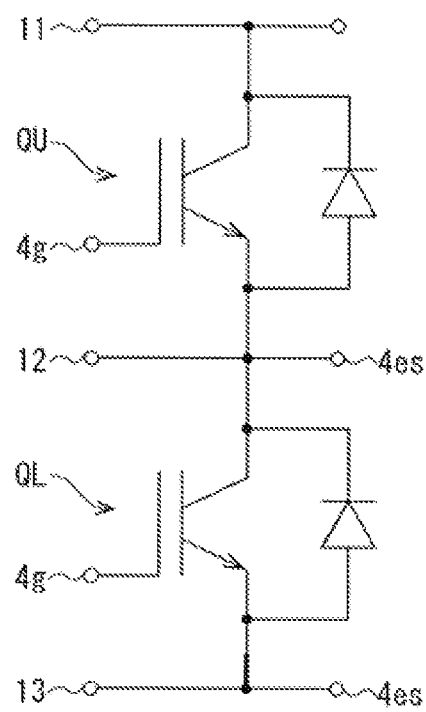
FIGS. 16A, 16B show diagrams showing the current output state from the emitter of the lower arm to the anode side connection terminal, that is used for describing the operation of the present invention, where
Figure 16B:
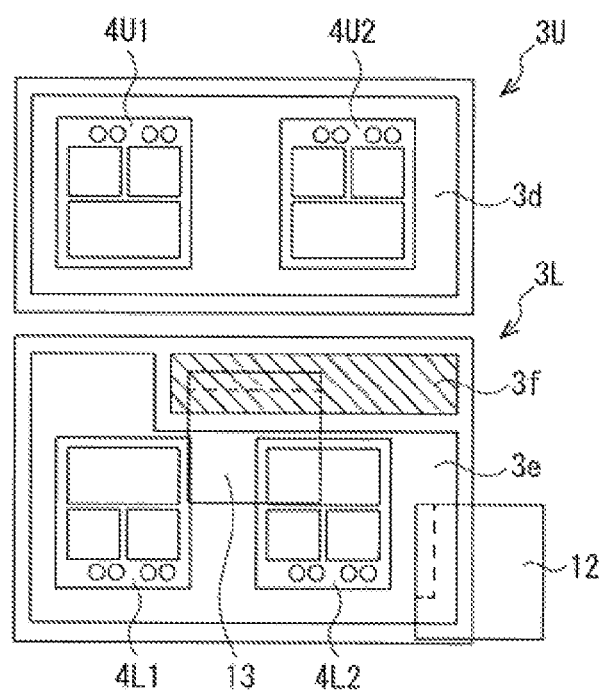
Figure 17A:
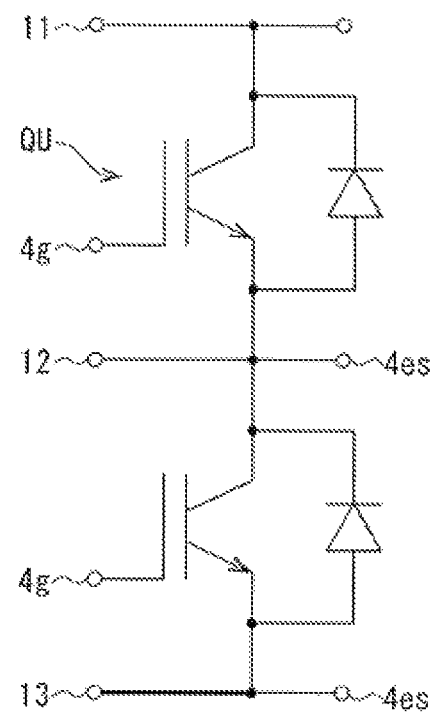
FIGS. 17A, 17B show diagrams showing the current output to the anode side connection terminal of the lower arm, that is used for describing the operation of the present invention, where
Figure 17B:
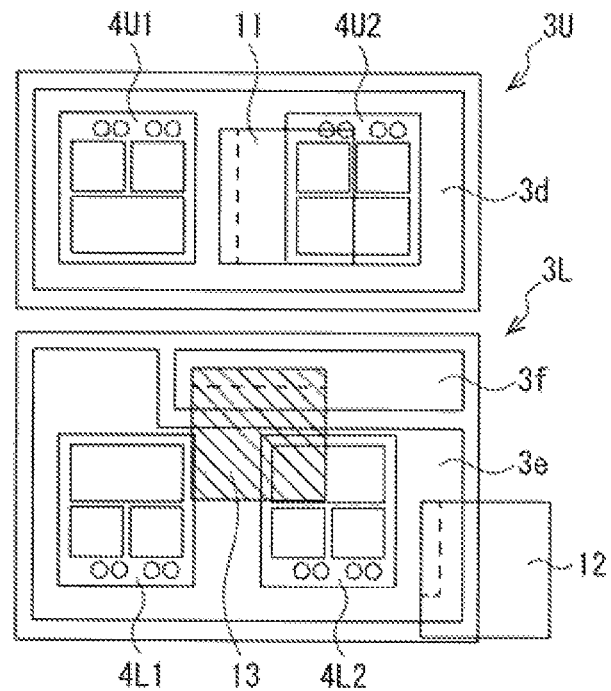

The current inputted to the collector of the reverse conducting IGBTQL is outputted from the emitter electrode 4Le in the upper part, and flows through the lower arm wiring conductor plate 5L, as illustrated in FIG. 15A and FIG. 15B, then through the ground wiring pattern unit 3f formed on the lower arm insulated substrate 3L, as illustrated in FIG. 16A and FIG. 16B, and enters the anode side connection terminal 13, as illustrated in FIG. 17A and FIG. 17B, and returns from this anode side connection terminal 13 to the anode side of the power supply.

Thus, one phase of the three-phase alternating current is generated by the reverse conducting IGBTs constituting the upper arm and the lower arm. Therefore, the three-phase alternating current of the U phase, V phase and W phase can be outputted to the load by controlling the ON/OFF of the three power semiconductor modules 1U to 1W using 120°-shifted gate signals.

If each of the power semiconductor modules 1U to 1W enters the operation state like this, each semiconductor chip 4U1, 4U2, 4L1 and 4L2, including the respective reverse conducting IGBTQU and IGBTQL, enter a heated state.

As illustrated in FIG. 2, heat generated in each semiconductor chip 4U1, 4U2, 4L1 and 4L2 is conducted to the lid 26 of the cooling body 21 via the upper arm wiring pattern unit 3d or the lower arm wiring pattern unit 3e, then via the insulating plate unit 3a, then via the heat radiation copper plate unit 3c, and then via the metal sintered material 20 generated by sintering metal particles.

Heat conducted to the lid 26 is cooled down by the cooling fins 27 that contact the cooling water.

In this case, the upper arm insulated substrate 3U and the lower arm insulated substrate 3L, on which the heating semiconductor chips 4U1, 4U2, 4L1 or 4L2 are mounted, are constituted by a relatively thin insulating plate unit 3a, and by the wiring pattern copper plate unit 3b and the heat radiation copper plate unit 3c which are formed on the front and rear faces of the insulating plate unit 3a respectively. The thickness of the wiring pattern copper plate unit 3b and that of the heat radiation copper plate unit 3c, which constitute the upper arm wiring pattern unit 3d and the lower arm wiring pattern unit 3e, are 0.7 mm or more (preferably 1 mm or more), hence, as described above, the thermal stress is relaxed and thermal resistance is suppressed, and as a result, thermal conduction efficiency can be improved.

Further, the heat radiation copper plate unit 3c of the upper arm insulated substrate 3U and that of the lower arm insulated substrate 3L are bonded by heating the metal particles respectively to 250° C. in a state of being pressurized at 10 MPa, for example, so as to evaporate the organic solvent and sinter metal particles, therefore, the bonding strength can be ensured while decreasing the bonding portion, and thermal conductivity can be improved.

Therefore, the heating of each semiconductor chip 4U1, 4U2, 4L1 and 4L2 can be transferred to the cooling body 21 at high thermal conduction efficiency, and the cooling body 21 can perform appropriate cooling, whereby overheating of each semiconductor chip 4U1, 4U2, 4L1 and 4L2 can be prevented with certainty.

Furthermore, the reverse conducting IGBTQU and IGBTQL are used as the switching elements that are included in the semiconductor chips 4U1, 4U2, 4L1 and 4L2, whereby the chip surface area can be reduced 50% compared with the case of an individual semiconductor chip enclosing an IGBT and an FWD, and as a result, the size of the power semiconductor modules 1U to 1W can be further decreased.

Furthermore, according to this embodiment, the current paths among the semiconductor chips 4U1, 4U2, 4L1 and 4L2 and the external connection terminals, which are the cathode side connection terminal 11, the output terminal 12 and the anode side connection terminal 13, are constituted by the upper arm wiring conductor plate 5U and the lower arm wiring conductor plate 5L that include the rod-shaped conductive posts 5Up and 5Lp respectively, and the upper arm wiring pattern unit 3d, the lower arm wiring pattern unit 3e and the ground wiring pattern unit 3f are formed of copper plates without using fine bonding wires, hence the wiring inductance can be decreased from 20 to 40 nH (when bonding wires are used) to 1 to 2 nH. Therefore, the switching speed can be increased. Further, without using the bonding wires, a lead frame 18 is used to connect the control terminals of the semiconductor chips 4U1, 4U2, 4L1 and 4L2 and the external connection control terminals 19, therefore, joule heating can be decreased compared with the case of using bonding wire.

Embodiment 2 of the present invention will now be described with reference to FIG. 18 and FIG. 19.

In Embodiment 2, the structure of the cooling body 21 is integrated.

Figure 18:
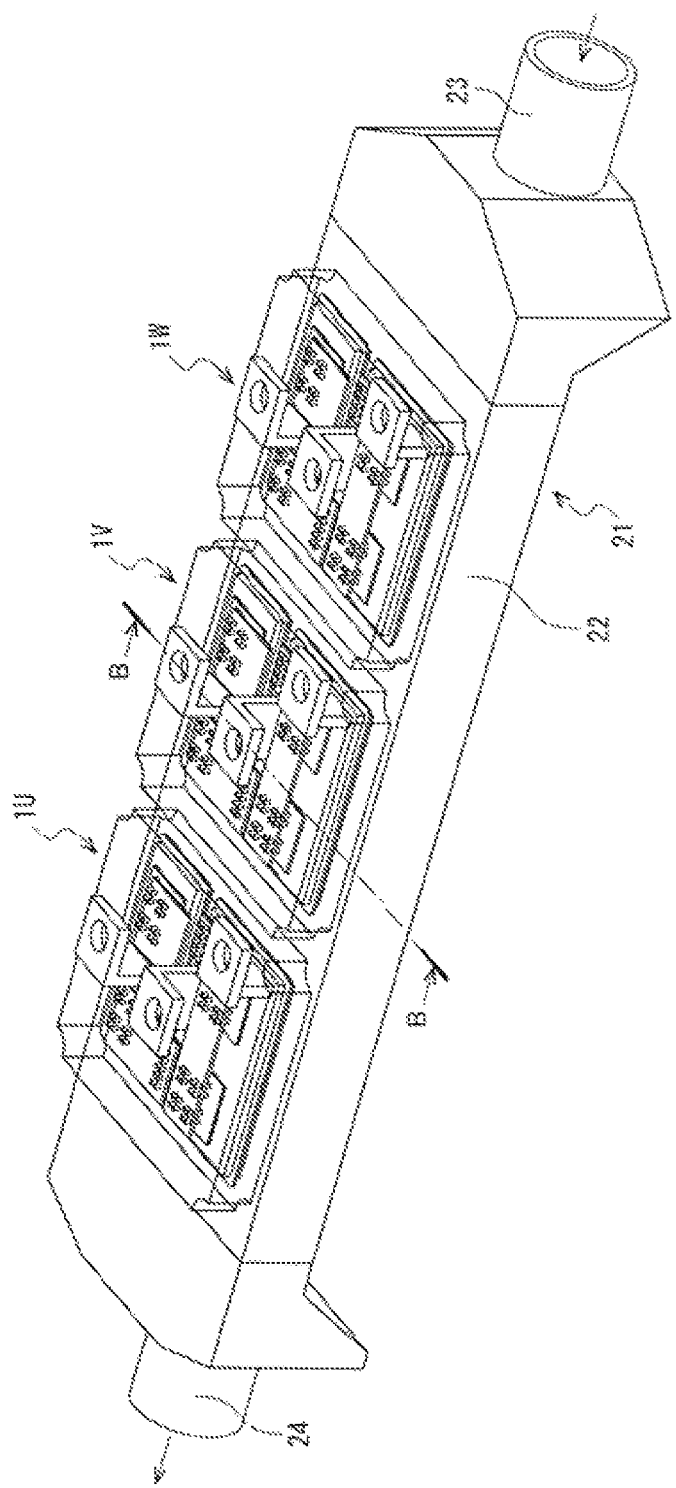
FIG. 18 is a perspective view depicting Embodiment 2 of the present invention.
Figure 19:
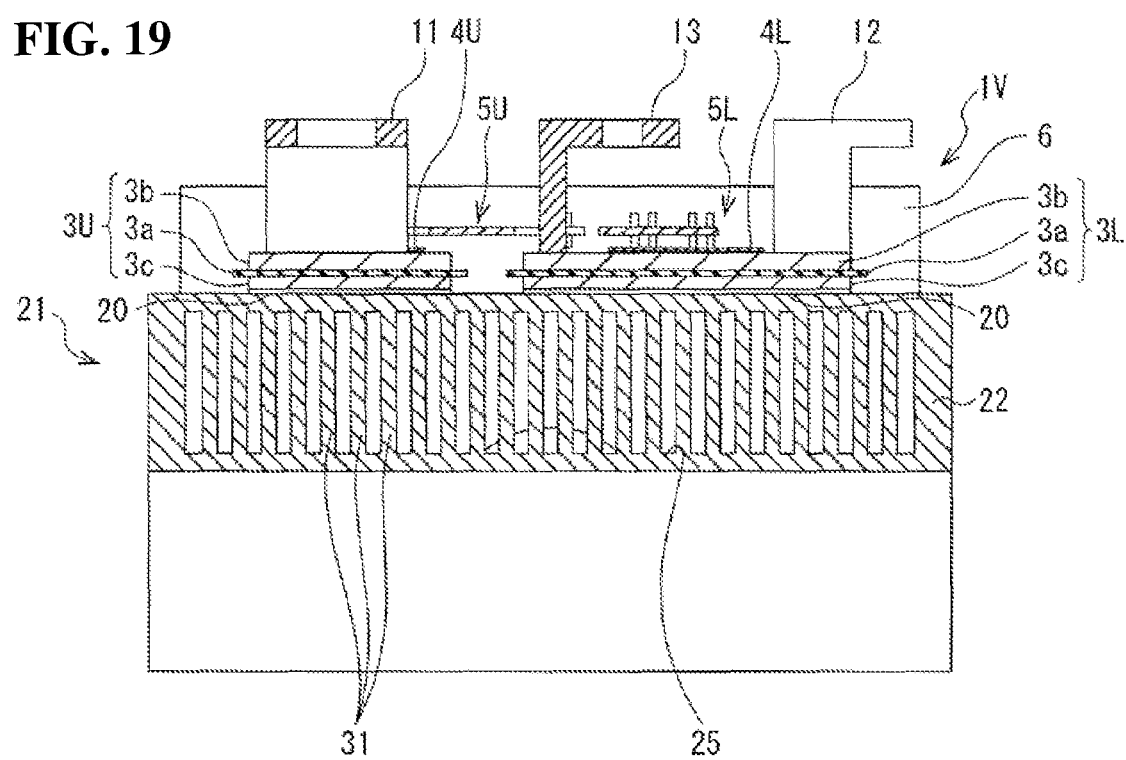
FIG. 19 is an enlarged cross-sectional view taken along line B-B in FIG. 18.

In other words, according to Embodiment 2, the cooling body 21 is not separated into the case body 22 and the lid 26, but many partitions 31, which correspond to the cooling fins, are directly disposed on the cooling water passage 25 of the case body 22 in the width direction at predetermined intervals, as illustrated in FIG. 18 and FIG. 19.

Then, on the upper surface of the case body 22, power semiconductor modules 1U to 1W, having a configuration similar to Embodiment 1 described above, are bonded to one another with a bonding member, such as Ag, by pressurizing and heating metal particles for sintering.

In Embodiment 2 as well, the power semiconductor modules 1U to 1W are bonded to the cooling body 21 by a bonding member which is sintered metal particles, therefore, the thermal conductivity of the bonding member can be increased, and firm bonding can be implemented.

Furthermore, the cooling body 21 has an integrated structure without any openings, hence, leakage of the cooling medium, such as cooling water, can be securely prevented.

In the above embodiments, a case using 2-in-1 type semiconductor modules 1U to 1W was described, but the present invention is not limited to this, and can be applied to various types of power semiconductor modules, including a 1-in-1 type, 4-in-1 type and 6-in-1 type.

A number of semiconductor chips constituting each arm is not limited to two either, and a number of chips that are disposed in parallel can be freely set in accordance with the current amount in use. Accordingly, a number of conductive posts can be freely set in accordance with the current amount in use.

In the above embodiments, a case disposing three power semiconductor modules 1U to 1W on the cooling body 21 was described, but the present invention is not limited to this, and any number of power semiconductor modules can be disposed in accordance with the intended use.

Further, in the above embodiments, a case using reverse conducting IGBTQU and IGBTQL for the switching elements enclosed in the semiconductor chips 4U1, 4U2, 4L1 and 4L2 was described, but the present invention is not limited to this, and a semiconductor chip including an IGBT and a semiconductor chip enclosing an FWD may be connected in reverse-parallel, or another voltage control type switching element, such as a power MOSFET (Metal-Oxide-Semiconductor Field-Effect Transistor) may be used instead of an IGBT.

In the above embodiment, a case molding the insulated substrate 3U for the upper arm, the insulated substrate 3L for the lower arm, the semiconductor chips 4U1, 4U2, 4L1 and 4L2, and the wiring conductor plate 5U for the upper arm and the wiring conductor plate 5L for the lower arm, using the insulating resin sealing member 6, was described, but the present invention is not limited to this, and the insulated substrate 3U for the upper arm, the insulated substrate 3L for the lower arm, the semiconductor chips 4U1, 4U2, 4L1 and 4L2, and the wiring conductor plate 5U for the upper arm and the wiring conductor plate 5L for the lower arm, may be covered by a case, and a gel type sealing member may fill inside the case.

In the above embodiments, a case disposing the insulated substrates 3U and 3L was described, but the present invention is not limited to this, and if the difference of a thermal expansion coefficient between the element constituting the insulated substrate and the sealing material is not an issue, then, in one insulating plate unit, a wiring pattern copper plate unit that has a plurality of wiring patterns of the upper arm wiring pattern unit 3d, the lower wiring pattern unit 3e and the ground wiring pattern unit 3f may be formed, and a common heat radiation heat conduction pattern (heat radiation copper plate unit) 3c, may be formed.

In the above embodiments, a ceramic base material, such as alumina ($Al_2O_3$) and aluminum nitride (AlN), may be used for the insulating plate unit 3a of the insulated substrates 3U and 3L.

Further, in the above embodiments, a case using cylindrical conductive posts 5Up and 5Lp was described, but the present invention is not limited to this, and any shape may be used for a conductive post, such as a quadrangular prism, triangular prism, polygonal prism and an elliptical cylinder. The conductive posts 5Up and 5Lp are only required to be conductive rods that can contribute to decreasing inductance. And instead of the upper arm wiring conductor plate 5U and the lower arm wiring conductor plate 5L constituted by the copper plates, a printed circuit board may be used.

The present invention allows obtaining a desired circuit configuration by simply combining the terminal connections of the power semiconductor modules, therefore, the present invention is not limited to the above mentioned invertor device for power conversion, but can be used for other semiconductor devices, such as other power convertors that use power semiconductor modules, and switching ICs for high frequencies.

EXPLANATION OF REFERENCE NUMERALS 1U to 1W power semiconductor module
3U upper arm insulated substrate
3L lower arm insulated substrate
3a insulating plate unit
3b wiring pattern copper plate unit
3c heat radiation copper plate unit
3d upper arm wiring pattern unit
3e lower arm wiring pattern unit
3f ground wiring pattern unit
4U, 4U1, 4U2 upper arm semiconductor chip
4L, 4L1, 4L2 lower arm semiconductor chip
5U upper arm wiring conductor plate
5L lower arm wiring conductor plate
5Up, 5Lp conductive post
6 insulating resin sealing member
11 cathode side connection terminal
12 output terminal
13 anode side connection terminal
17 external connection auxiliary terminal
20 metal sintered material
21 cooling body
22 case body
23 inlet
24 outlet
25 cooling water passage
26 lid
27 cooling fin

What is claimed is:

1. A semiconductor device, comprising:
an insulated substrate including an insulating plate unit formed from ceramic, a wiring pattern copper plate unit for forming wiring patterns disposed on one side of the insulating plate unit, and a heat radiation copper plate unit disposed on another side of the insulating plate unit;
a semiconductor chip mounted on the wiring pattern copper plate unit of the insulated substrate;
a cooling body formed from aluminum or aluminum alloy and bonded to the heat radiation copper plate unit of the insulated substrate; and
a wiring conductor plate connected to the semiconductor chip and the wiring pattern copper plate unit,
wherein the heat radiation copper plate unit of the insulated substrate and the cooling body are bonded to each other with a metal sintered material with a predetermined bonding strength for preventing cracking of the insulating plate unit and separation between the cooling body and the heat radiation copper plate unit, and
a thickness of the wiring pattern copper plate unit and a thickness of the heat radiation copper plate unit are substantially same to each other and set to a thickness, at which thermal stress is relaxed,
a linear expansion coefficient of the wiring pattern copper plate unit and the heat radiation copper plate unit are 16 ppm to 18 ppm,
a linear expansion coefficient of the insulating plate unit is 3 ppm to 5 ppm,
a linear expansion coefficient of the cooling body is 22 ppm,
the thickness of the wiring pattern copper plate unit and the heat radiation copper plate unit are 0.7 mm, and
a thickness of the metal sintered material is 25 μm.

2. The semiconductor device according to claim 1, wherein the thickness of the wiring pattern copper plate unit and the thickness of the heat radiation copper plate unit are set to the thicknesses, at which thermal stress is relaxed and thermal resistance is suppressed.

3. The semiconductor device according to claim 1, further comprising conductive rods electrically connecting the wiring conductor plate with the semiconductor chip and the wiring pattern copper plate unit.

4. The semiconductor device according to claim 3, wherein each of the conductive rods includes a fitting portion to fit the wiring conductor plate, and rod portions protruding from the fitting portion upwardly and downwardly and connecting the semiconductor chip and the wiring pattern copper plate unit, and the fitting portion has a cross-sectional area larger than a cross-sectional area of the rod portions.

5. The semiconductor device according to claim 1, wherein the semiconductor chip is one chip comprising an insulated gate bipolar transistor and a free wheeling diode inversely connected to the insulated gate bipolar transistor, integrally formed together.

6. The semiconductor device according to claim 1, wherein the wiring pattern copper plate unit of the insulated substrate further comprises an upper arm wiring pattern unit on which the semiconductor chip constituting an upper arm is mounted, a lower arm wiring pattern unit on which another semiconductor chip constituting a lower arm is mounted, and a ground wiring pattern unit, which are formed on the insulating plate unit independently from one another.

7. The semiconductor device according to claim 6, further comprising a cathode side connection terminal connected to the upper arm wiring pattern unit, an output terminal connected to the lower arm wiring pattern unit, and an anode side connection terminal connected to the ground wiring pattern unit.

8. The semiconductor device according to claim 6, wherein the wiring conductor plate includes a first wiring conductor plate unit that connects the semiconductor chip constituting the upper arm and the another semiconductor chip constituting the lower arm wiring pattern unit, and a second wiring conductor plate unit that connects the another semiconductor chip constituting the lower arm and the ground wiring pattern unit.

9. The semiconductor device according to claim 1, wherein the metal sintered material is formed from a paste including an organic solvent and metal particles such that when the heat radiation copper plate unit is pressurized and heated, the organic solvent evaporates and the metal particles are sintered to form the metal sintered material to bond the heat radiation copper plate unit and the cooling body with the predetermined bonding strength.

* * * * *